United States Patent [19]
Kolte

[11] Patent Number: 5,381,052
[45] Date of Patent: Jan. 10, 1995

[54] PEAK DETECTOR CIRCUIT AND APPLICATION IN A FIBER OPTIC RECEIVER

[75] Inventor: Ravindra N. Kolte, Boxborough, Mass.

[73] Assignee: Digital Equipment Corporation, Maynard, Mass.

[21] Appl. No.: 88,291

[22] Filed: Jul. 6, 1993

[51] Int. Cl.$^6$ .......................................... H03K 5/153
[52] U.S. Cl. .......................................... 327/60; 327/58; 327/72; 327/68; 327/63
[58] Field of Search ................. 307/351, 264, 354–356, 307/358

[56] References Cited

U.S. PATENT DOCUMENTS

| | | | |
|---|---|---|---|
| 4,219,152 | 8/1980 | Couch et al. | 235/463 |
| 4,241,455 | 12/1980 | Eibner | 455/600 |
| 4,431,916 | 1/1984 | Couch | 250/214 R |
| 4,613,769 | 9/1986 | Gross et al. | 307/351 |
| 4,631,737 | 12/1986 | Davis et al. | 375/88 |
| 4,827,191 | 5/1989 | Chapman | 341/132 |
| 4,987,323 | 1/1991 | Fujita | 307/351 |
| 4,990,912 | 2/1991 | Selwa | 341/132 |
| 4,992,674 | 2/1991 | Smith | 307/351 |
| 5,025,176 | 6/1991 | Takeno | 307/351 |
| 5,120,995 | 6/1992 | Abdi | 307/351 |
| 5,159,340 | 10/1992 | Smith | 341/132 |
| 5,231,397 | 6/1993 | Ridkosil | 341/155 |
| 5,287,063 | 1/1994 | Izawa | 324/601 |
| 5,289,278 | 2/1994 | Bird | 307/351 |

OTHER PUBLICATIONS

"125 MSPS Monolithic Sampling Amplifier," AD9101, Analog Devices Data Book, (Norwood, Mass.).
"Application Note 13", Linear Technology Data Book, pp. 22–23.
Y. Ota and R. G. Swartz, "Burst–Mode Campatible Optical Receiver With A Large Dynamic Range," Journal of Lightwave Technology, vol. 8, No. 12, Dec. 1990, pp. 1897–1902.
Y. Ota and R. G. Swartz, "DC–1 Gb/s Burst–Mode Compatible Receiver for Optical Bus Applications," Journal of Lightwave Technology, vol. 10, No. 2, Feb. 1992, pp. 244–249.
Y. Ota, R. G. Swartz and V. D. Archer, "DC–1 Gb/s Burst Mode Receiver for Optical Bus Applications," SPIE vol. 1577 High-Speed Fiber Networks and Channels (1991), pp. 155–162.

Primary Examiner—Margaret Rose Wambach
Attorney, Agent, or Firm—James F. Thompson; Ronald C. Hudgens; Albert P. Cefalo

[57] ABSTRACT

A peak detector for use in a fiber optic receiver has a capacitor, an input amplifier driving the capacitor, and a feedback differential amplifier coupled between the capacitor and an input of the input amplifier. The input amplifier is a complementary buffer with unity gain modified to include an additional transistor on one rail that receives an inverter voltage generated by the differential amplifier. The inverter voltage equals the difference between twice the capacitor voltage and an input voltage applied to the peak detector. The input amplifier in a positive peak detector functions so that the capacitor voltage tracks the input voltage when it exceeds the inverter voltage, and equals the average of the input voltage and inverter voltage when the input voltage is less than the inverter voltage. A negative peak detector operates similarly but with opposite polarity. The peak detector also contains transistors used to reset the capacitor voltage upon assertion of a reset signal. The input amplifier circuit is also used with slight modification as part of a track-and-hold amplifier. The peak detector circuit works on the principle of counter-balancing the deviation of the input signal from the detected peak value. Thus the advantage of the circuit is that it needs comparatively low gain circuit compared to other approaches. The sample-and-hold or track-and-hold circuit works on the principle of switching the charging current path in a manner similar to a differential amplifier, resulting in very fast switching time.

11 Claims, 6 Drawing Sheets

PEAK DETECTOR CIRCUIT AND APPLICATION IN A FIBER OPTIC RECEIVER

FIELD OF THE INVENTION

The present invention relates to voltage-tracking analog circuits such as track-and-hold amplifiers and peak detectors, especially peak detectors used in digital data receivers such as fiber optic receivers.

BACKGROUND OF THE INVENTION

A fundamental function of digital data receivers such as fiber optic receivers is to discriminate between different values of some characteristic of the received signal in order to distinguish a logic ONE from a logic ZERO. A fiber optic receiver, for example, must discriminate between two intensities of the received light signal. This function is difficult to perform for many reasons. The absolute levels of the signal may vary substantially due to factors such as the length of the transmission path, the number and quality of couplings in the path, and normal tolerances and aging of optical and electrical components along the path. Digital data receivers therefore must be able to operate over a wide range of input signal levels.

One general approach to designing receivers to accommodate widely-varying input signals is to AC couple a front-end transducer, such as a PIN diode in a fiber optic receiver, to subsequent amplifier stages. This AC coupling is achieved by placing a series capacitor between the transducer and the amplifier. AC coupling has the effect of filtering out the average DC component of the received signal, regardless of its magnitude. Subsequent amplifier stages are typically high-gain stages designed to amplify small AC signals, i.e., signals having an average DC content of zero volts.

AC coupling has drawbacks that make it unattractive for use with unconditioned digital data. Digital data as a general rule has no fixed average DC level; its average level can vary from near zero in a long string of ZEROs to near some maximum voltage in a long string of ONEs. The average level can also change quickly, because data tends to be transmitted in bursts. If AC coupling were to be employed with such data, data bits occurring near steep changes in the average DC value would be undetectable, because the DC component of the signal would saturate the input of the subsequent amplifier stage until the coupling capacitor became charged. These problems with AC coupling can be overcome by using a preamble to prepare the receiver for incoming data, or by encoding the data such that the transmitted data has a more consistent average DC value. However, both of these methods add to the transmission delay of the data; in some computer interconnect, this added delay may be unacceptable. These methods also may unduly increase the design complexity of the receiver.

Another general approach is to employ DC coupling in digital data receivers. Because the input signal is directly coupled to the amplifier stages in a DC coupled receiver, the problems of charging and discharging a coupling capacitor are eliminated. However, DC coupling schemes must still accommodate signal levels and average DC values that vary widely. Therefore DC coupling schemes generally require some way of adjusting the switching threshold separating logic ONEs and ZEROs.

A popular configuration for DC coupled receivers employs a pair of peak detectors to detect the most positive and most negative excursions of the received signal, and to hold these values for long enough to be used throughout a subsequent data transmission. A voltage divider is employed at the outputs of the peak detectors to generate a voltage midway between the two extremes that represents the desired switching threshold. The output of the voltage divider is typically connected along with the received signal to the input of a differential amplifier. When the signal subsequently exceeds the threshold, the output of the differential amplifier is a logic ONE; when the signal is less than the threshold, the output of the differential amplifier is a logic ZERO.

A peak detector of the type used in DC coupled receivers is a special type of voltage-following amplifier, and is therefore akin to other such amplifiers, such as track-and-hold amplifiers widely used in electronic signal processing. These amplifiers typically employ a storage capacitor to hold a value of the input signal for some time. In a peak detector, the held value is a peak value, while in track-and-hold amplifiers, it is merely the value of the input signal at the time that a HOLD signal becomes asserted. The storage capacitor is typically charged through a switching element such as a diode or the base-emitter junction of a bipolar transistor. When the switching element is ON, it enables current to flow to the capacitor, allowing its voltage to follow that of the input signal. When the switching element is OFF, current flow is disabled.

It is generally advantageous for the voltage-following circuit to be able to switch between ON and OFF rapidly. First of all, this allows the circuit to operate on higher-frequency signals, such as those present in a fiber optic data link. Also, rapid switching contributes to greater accuracy in sampling the input signal. During switching, the storage capacitor may continue to charge, so that the stored voltage is slightly different from the input voltage to be held. In a peak detector, for example, this additional charge causes the output to vary from the true peak by perhaps tens of millivolts. This can be a significant error, especially when the input signal level is of the same order. Furthermore, the amount of this error varies with the average DC level of the data, and therefore cannot be compensated for a priori. Decreasing the switching time of the circuit can diminish this erroneous charging of the storage capacitor.

SUMMARY OF THE INVENTION

It is accordingly an object of the invention to improve the performance of DC-coupled receivers and other electronic systems by improving the response time and accuracy of peak detectors and other voltage-following circuits employed therein.

A peak detector in accordance with the invention has a capacitor to store a capacitor voltage representing the peak excursion of an input signal, a differential inverter whose inputs are the capacitor voltage and the input signal to generate an inverter voltage equal to the difference between twice the capacitor voltage and the input voltage, and an input amplifier whose inputs are the input signal and the inverter voltage to drive the capacitor in two different modes: when the difference between the input voltage and the inverter voltage has a predetermined polarity, the capacitor voltage follows the input voltage; and when the difference between the input voltage and the inverter voltage has the opposite polarity, the capacitor voltage equals the average of the input voltage and the inverter voltage. Because the inverter voltage mirrors the input voltage about a particular capacitor voltage, their average is merely the existing capacitor voltage, which is the previous peak value.

Because of this configuration of the peak detector, the capacitor does not continue to charge when the input voltage is near the capacitor voltage, as do conventional peak detectors. The mirroring effect cancels out charging current and causes the capacitor voltage to retain its previous value. This feature increases both the accuracy and consistency of the peak detector by substantially eliminating capacitor charging during switching. The peak detector circuit works on the principle of counter-balancing the deviation of the input signal from the detected peak value, and so requires comparatively low gain circuit compared to other approaches.

In another aspect, the invention includes a novel voltage-following circuit configuration. This circuit employs a complementary unity-gain buffer with an additional transistor connected to one or both sides and having a separate input. When they are part of the above-described peak detector, the additional transistors implement the averaging function described above to increase the accuracy of the peak detector. The transistors can also receive a separate signal, such as the HOLD signal in a track-and-hold amplifier, and switch the circuit ON and OFF very rapidly. The sample-and-hold or track-and-hold circuit works on the principle of switching the charging current path in a manner similar to a differential amplifier, resulting in very fast switching time.

BRIEF DESCRIPTION OF THE DRAWINGS

An embodiment of the invention will be described with reference to the accompanying drawings, in which.

DESCRIPTION OF THE PREFERRED EMBEDMENT

Figure 1:
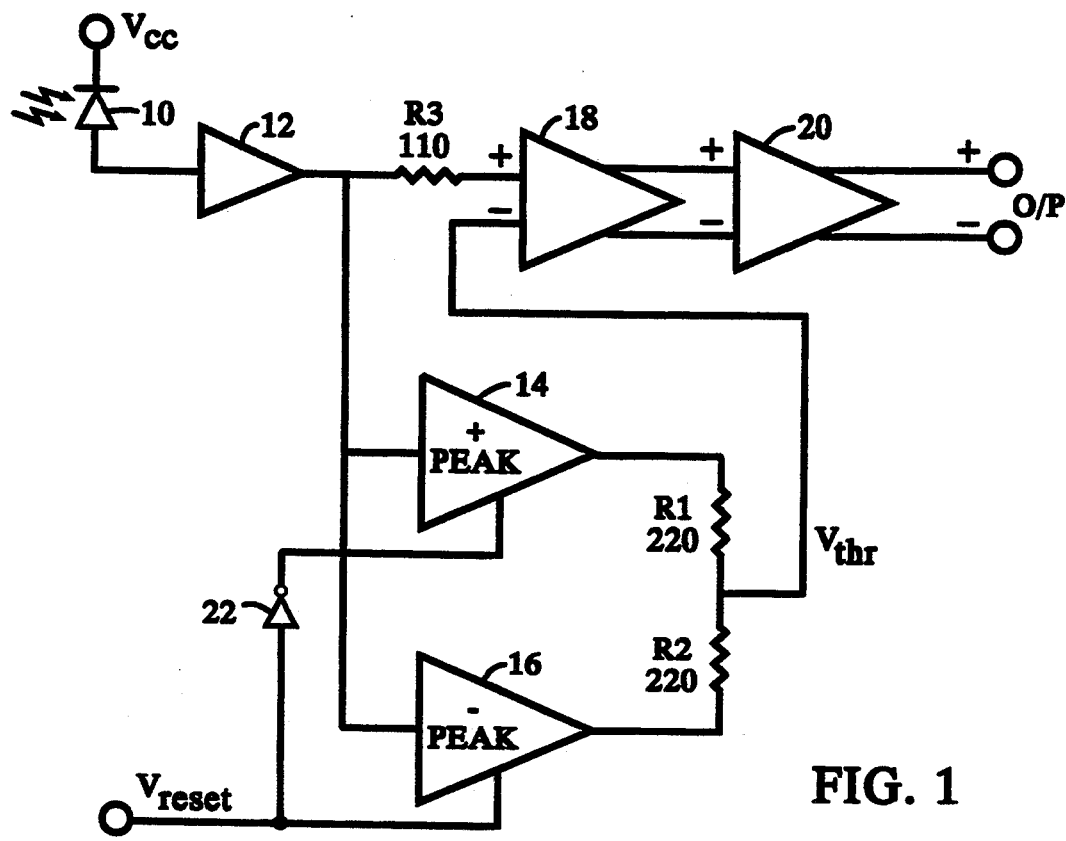
FIG. 1 is a block diagram of a fiber optic receiver in accordance with the principles of the present invention.

FIG. 1 shows a DC coupled fiber optic receiver that advantageously employs the present invention. A PIN diode 10 detects received light power and generates an output current proportional thereto. This current is converted to a voltage signal by a transimpedance amplifier 12, whose output is coupled to a positive peak detector 14, negative peak detector 16, and to the non-inverting input of a differential level-shifting amplifier 18 via a resistor R3. The outputs of the peak detectors 14 and 16 are fed to a voltage divider consisting of resistors R1 and R2, the output of which is labelled $V_{thr}$ and is connected to the inverting input of the amplifier 18. The output of the amplifier 18 is fed to a differential post amplifier 20 that provides a binary output signal representing the received light signal.

The voltage divider output $V_{thr}$ is a threshold voltage used by the amplifier 18 to distinguish binary ONEs from binary ZEROs. The peak detectors 14, 16 and the voltage divider operate to set this threshold midway between the detected extremes of the signal generated by the transimpedance amplifier 12. The peak detectors set this threshold very quickly during the first bit period of a data burst, so that the data in the burst can be correctly detected.

A reset signal $V_{reset}$ is applied to the negative peak detector 16, and also to an inverter 22 which provides an inverted reset signal to the positive peak detector 14. The reset input provides a means for quickly resetting the output voltages of the peak detectors 14, 16. This feature could be used under various circumstances such as testing, initialization, and between data bursts during operation. It could also be used with external error detection circuitry to reset the peak detectors 14, 16 after an erroneous peak has been detected.

Figure 2:
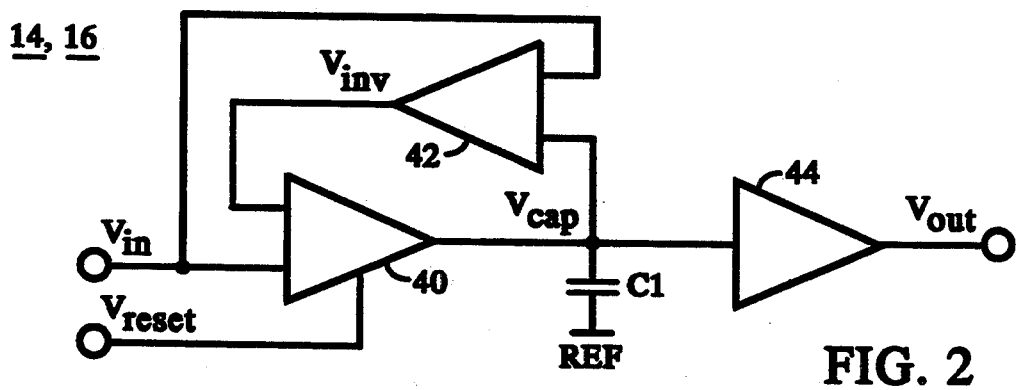
FIG. 2 is a block diagram of peak detector circuits used in the receiver of FIG. 1.

FIG. 2 shows a block diagram of the peak detectors 14, 16 of FIG. 1. The input voltage signal $V_{in}$ and the reset signal $V_{reset}$ are applied to an input amplifier 40. The output of the amplifier 40 is tied to one terminal of a capacitor C1, whose voltage is labelled $V_{cap}$. The other terminal of the capacitor C1 is tied to an appropriate supply reference REF, which is a negative supply reference (e.g., ground) in the positive peak detector 14, and a positive supply reference (e.g., Vcc) in the negative peak detector 16. The output of the input amplifier 40 is also connected to the input of a differential inverter 42 and to the input of an output buffer 44. The differential inverter 42 receives the input signal $V_{in}$ on another input, and generates a voltage signal $V_{inv}$ that is applied to the other input of the input amplifier 40. The output buffer 44 is preferably one having a FET input stage, so that current leakage from the capacitor C1 is minimized. The output of the output buffer 44 is the peak detector output signal $V_{out}$.

The input amplifier 40 and differential inverter 42 carry out special functions to achieve the aforementioned advantages of the present invention. The differential inverter 42 generates the signal $V_{inv}$ such that the following relationship is obeyed:

$$V_{inv} = 2 V_{cap} - V_{in}$$

As a result, there is an operating point where $V_{inv} = V_{cap} = V_{in}$. In the neighborhood of that operating point, small changes in $V_{in}$ are reflected as equal but opposite changes in $V_{inv}$.

The input amplifier 40 controls the capacitor voltage $V_{cap}$ based on the signals $V_{inv}$ and $V_{in}$ as follows:

i) $V_{cap}$ follows $V_{in}$ when the difference $(V_{in} - V_{inv})$ has a given polarity (positive in the positive peak detector 14, and negative in the negative peak detector 16).

ii) $V_{cap}$ equals the average of $V_{in}$ and $V_{inv}$, $(V_{in} + V_{inv})/2$, when the difference $(V_{in} - V_{inv})$ has the opposite polarity.

The significance of these functional characteristics of the input amplifier 40 and the differential inverter 42 is described below with reference to FIGS. 3 and 4.

Figure 3:
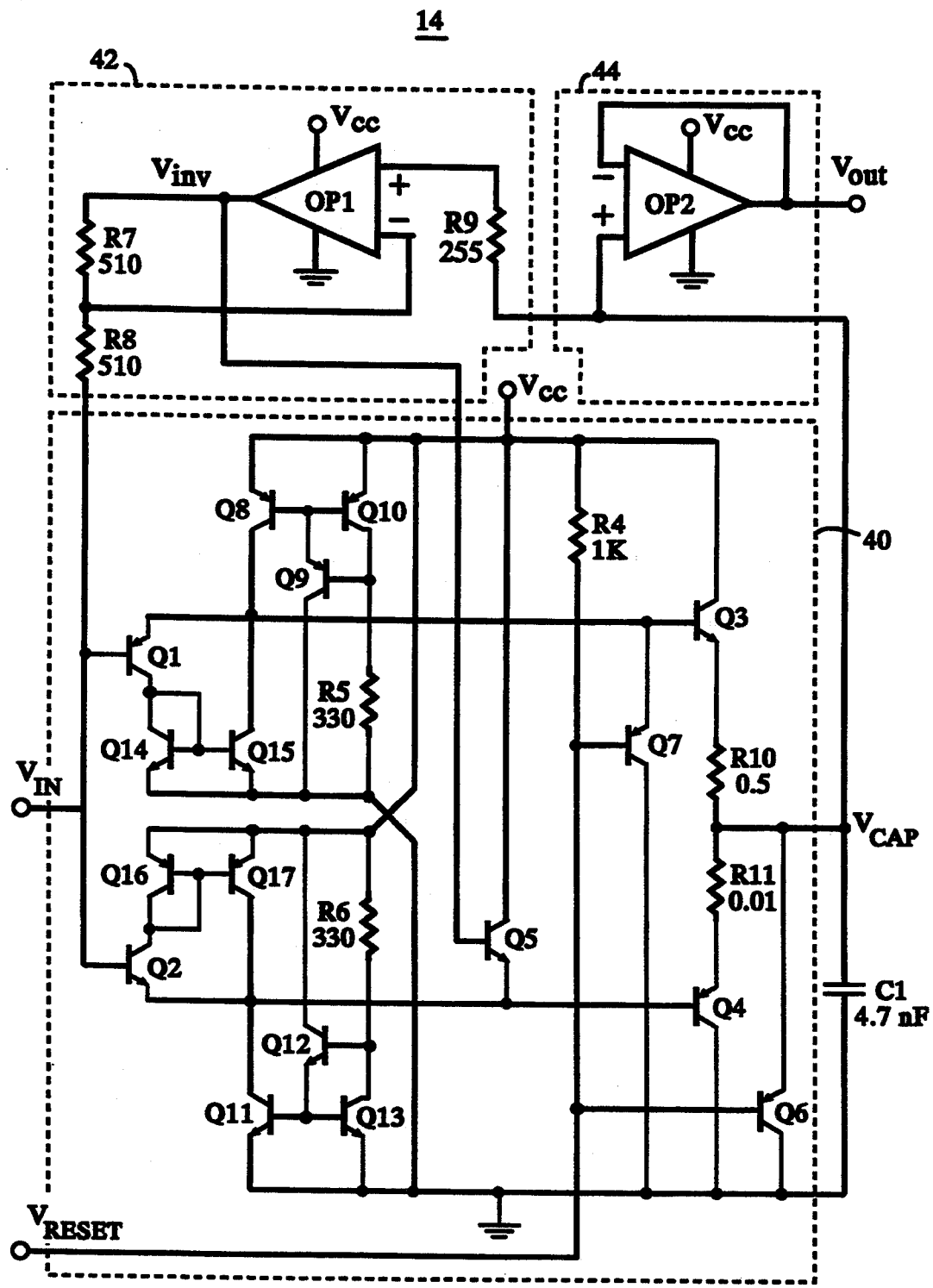
FIG. 3 is a schematic diagram of a positive peak detector circuit in the receiver of FIG. 1.

FIG. 3 shows an implementation of the positive peak detector 14 of FIG. 1 that functions in the manner described above with reference to FIG. 2. The voltage of the positive supply reference Vcc is +5 volts with respect to the negative supply reference, ground. The output buffer 44 of FIG. 2 is implemented by an op-amp OP2 configured as a voltage follower, and the differential inverter 42 of FIG. 2 is implemented by op-amp OP1 and resistors R7, RS, and R9. In the illustrated embodiment, op-amps OP1 and OP2 are EL2073 op-amps.

The input amplifier 40 of FIG. 2 is implemented by the remaining circuitry in FIG. 3. It will be seen that the input amplifier 40 is generally symmetric in construction with the exception of transistor Q5, which receives the signal $V_{inv}$, and transistors Q6 and Q7, which implement the reset function. Transistors QS, Q9, and Q10 and resistor R5 form a 10 mA constant current source, while transistors Q11, Q12, and Q13 and resistor R6 form a $-10$ mA constant current source. Transistors Q1, Q2, Q3, and Q4 form a complementary pair buffer, with Q1 and Q2 configured as emitter-follower input transistors, and Q3 and Q4 configured as emitter-follower output transistors. Resistors R10 and R11 are small series terminators used to limit overshoot on the signal $V_{cap}$. Current mirrors consisting of transistors Q14, Q15, Q16, and Q17 are also used to limit overshoot at the output. The circuit without transistors QS, Q6, and Q7 is a unity gain buffer driving the capacitive load C1 such that $V_{cap}=V_{in}$.

The circuit of FIG. 3 has been built using discrete components. In that embodiment, the NPN transistors were of the type 2N3904, and the PNP transistors were of the type 2N3906. The circuit of FIG. 3 may also be built as a custom integrated circuit, which would potentially result in improved matching of complementary components. Such an integrated embodiment might require laser trimming to obtain acceptable matching between corresponding NPN and PNP devices, for example Q3 and Q4.

In the description of the operation to follow, the cutoff voltage of the transistors shown in FIG. 3 is assumed to be 0.4 volts. The description is equally applicable to other cutoff voltages with corresponding modification of the operating ranges.

When the difference $(V_{in}-V_{inv})$ is positive (i.e., $V_{in}$ is greater than $V_{inv}$), transistor Q5 has little or no effect, and $V_{cap}$ follows $V_{in}$. When $V_{in}$ reaches a peak value $V_{peak}$, then $V_{inv}=V_{cap}=V_{in}=V_{peak}$. As $V_{in}$ recedes from $V_{peak}$, $(V_{in}-V_{inv})$ becomes negative (i.e., $V_{in}$ becomes less than $V_{inv}$), and transistor Q5 starts to come into play. Transistor Q5 pulls the base voltage of transistor Q4 up by the same amount that transistor Q1 is pulling the base voltage of transistor Q3 down. Therefore the voltage $V_{cap}$ is held at the average of $V_{in}$ and $V_{inv}$, which due to capacitor C1 and the differential inverter 42 is simply the peak voltage $V_{peak}$. This occurs as long as $(V_{in}-V_{inv})$ is between 0 and $-0.8$ volts, which is twice the cutoff voltage of the transistors. When $(V_{in}-V_{inv})$ is below this point, the transistors Q3 and Q4 are cutoff, and the capacitor C1 merely retains the voltage $V_{peak}$ until it is reset or a greater peak occurs.

Figure 4:
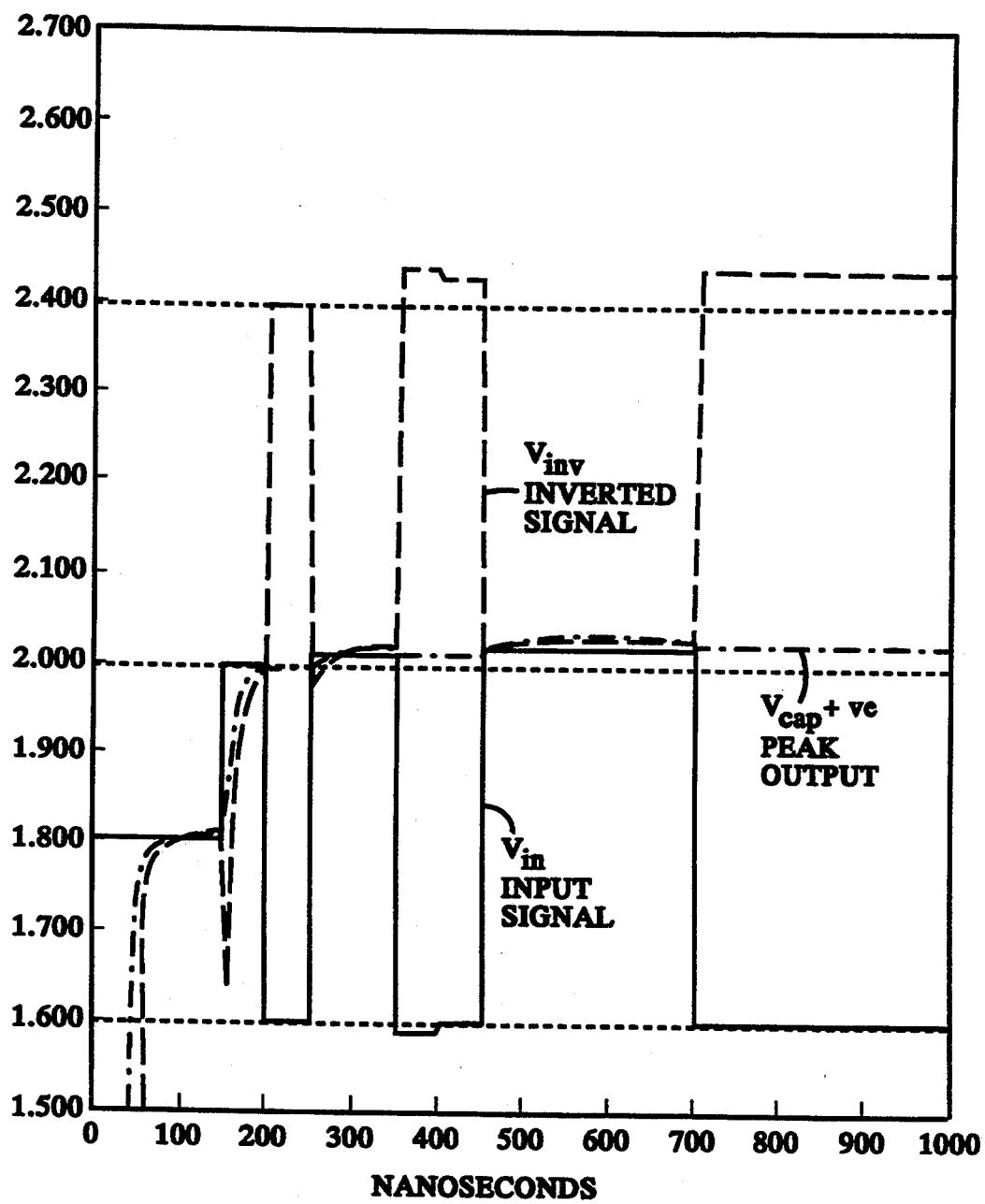
FIG. 4 is a waveform plot of various voltage signals appearing in the positive peak detector of FIG. 3.

FIG. 4 shows the results of a SPICE simulation of the peak detector of FIG. 3. This plot shows how the signal $V_{inv}$ mirrors the input signal $V_{in}$ about $V_{cap}$, resulting in $V_{cap}$ remaining constant whenever the input signal $V_{in}$ is below the immediately-preceding peak.

Figure 5:
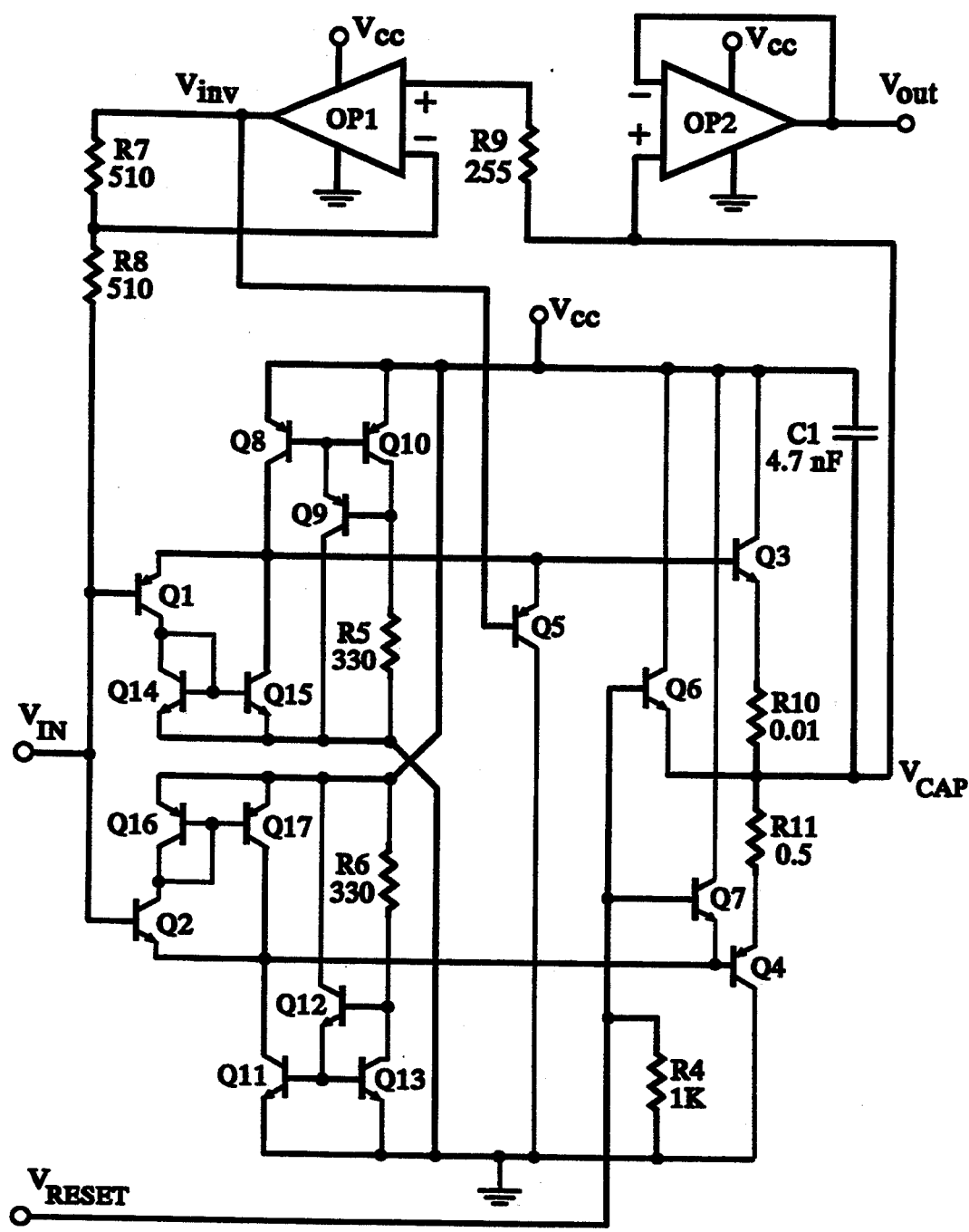
FIG. 5 is a schematic diagram of a negative peak detector circuit in the receiver of FIG. 1.

FIG. 5 is a schematic diagram of the negative peak detector 16 of FIG. 1. It will be readily seen that it is constructed similarly to the positive peak detector 14 of FIG. 3, except that the capacitor C1 is referenced to Vcc instead of ground, and transistors Q5, Q6, and Q7 operate in the opposite direction than that of their counterparts in the positive peak detector 14. The operation of the negative peak detector 16 is the same as the operation of the positive peak detector 14 except for its polarity: $V_{cap}$ follows $V_{in}$ when the difference $(V_{in}-V_{inv})$ is negative (i.e., $V_{in}$ is less than $V_{inv}$), and transistor Q5 starts to come into play when $(V_{in}-V_{inv})$ becomes positive (i.e., $V_{in}$ becomes greater than $V_{inv}$).

Figure 6:
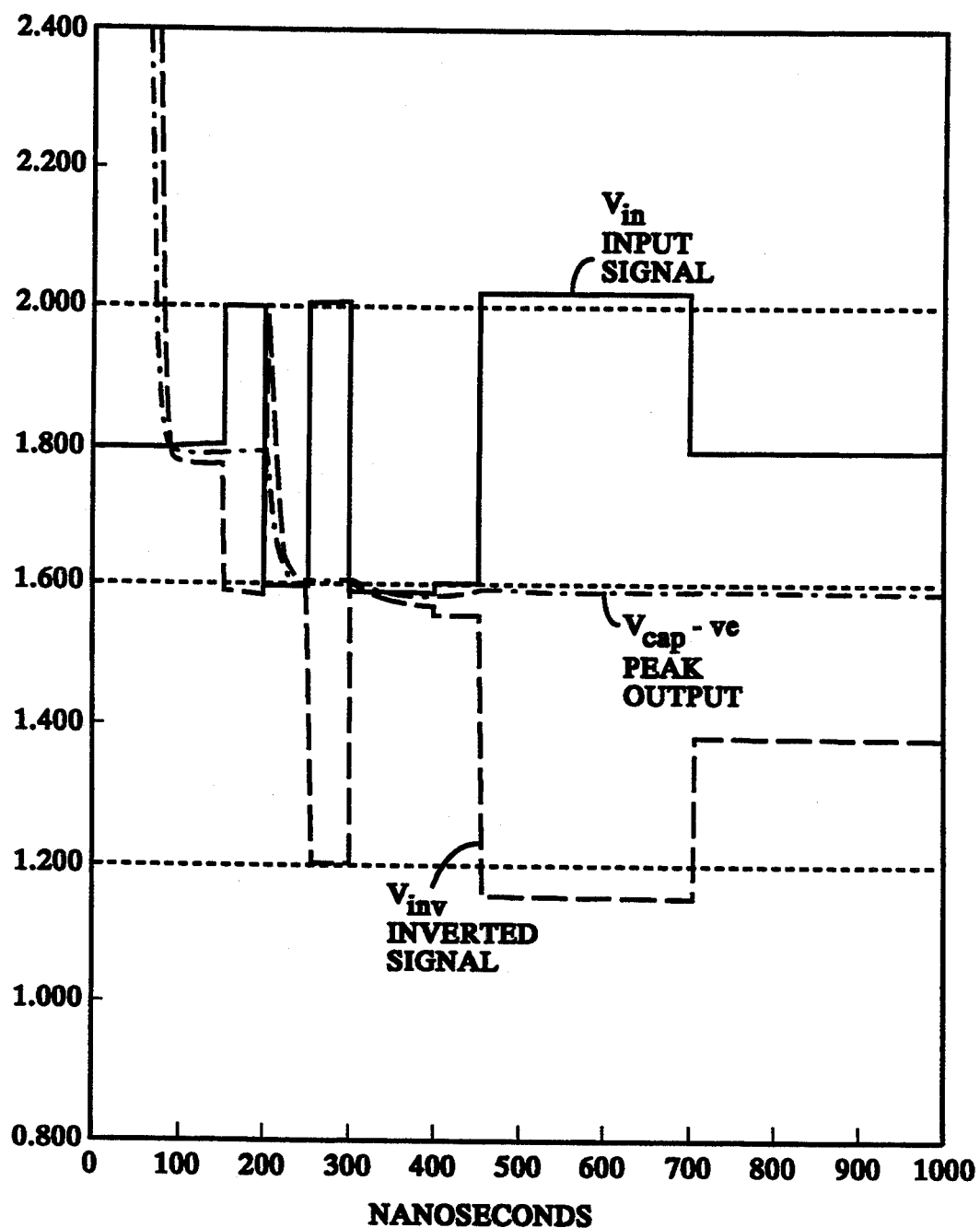
FIG. 6 is a waveform plot of various voltage signals appearing in the negative peak detector of FIG. 5.

FIG. 6 shows the results of a SPICE simulation of the negative peak detector 16 of FIG. 5. These results are similar to those shown in FIG. 4 except for the polarity of the excursions of $V_{in}$, $V_{inv}$, and $V_{cap}$.

Figure 7:
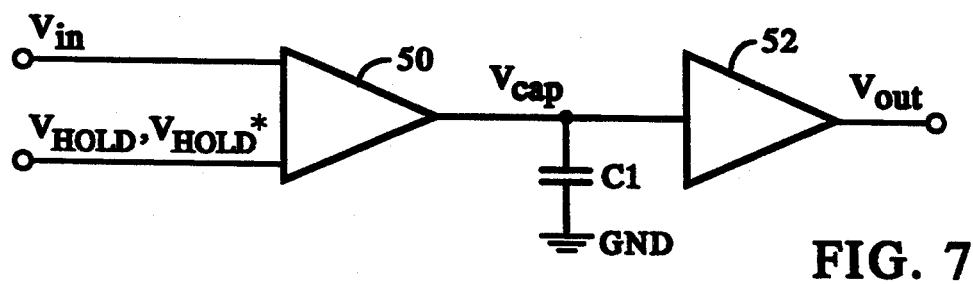
FIG. 7 is a block diagram of a track-and-hold amplifier in accordance with the principles of the present invention.

While the foregoing description has focused primarily on peak detectors, it is clear that a circuit such as those shown in FIGS. 3 and 5 have broader application in voltage-following circuits. For example, FIG. 7 is a block diagram of a track-and-hold amplifier employing the principles of the present invention. An input amplifier 50 receives an input signal $V_{in}$ and complementary HOLD signals $V_{hold}$ and $V_{hold}*$, which may be generated in a conventional fashion by, for example, a periodic pulse generator. The output of the input amplifier 50 is connected to a capacitor C1 where the signal $V_{cap}$ appears. An output buffer 52 provides buffering between the signal $V_{cap}$ and the output signal $V_{out}$.

The well-known function of the track-and-hold amplifier of FIG. 7 is to make the output signal $V_{out}$ follow or track the input signal $V_{in}$ when the HOLD signal is de-asserted, i.e., when $V_{hold}$ is LOW and $V_{hold}*$ is HIGH, and to make $V_{out}$ maintain or hold its previous value whenever the HOLD signal is asserted. The amplifier of FIG. 7 achieves this functionality via the capacitor C1 and circuitry within the input amplifier 50, as will be shown.

Figure 8:
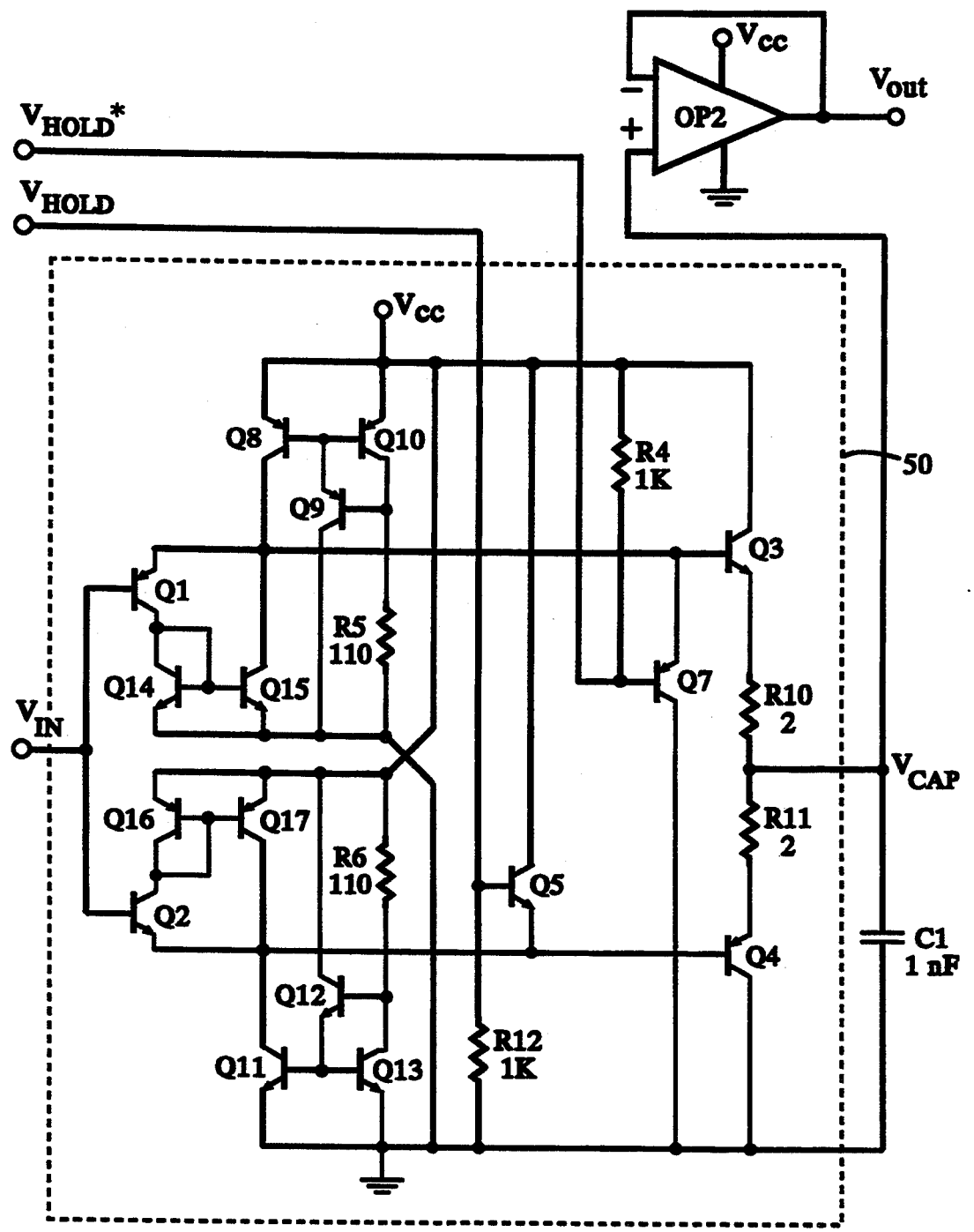
FIG. 8 is a schematic diagram of an input amplifier in the track-and-hold amplifier of FIG. 7.

FIG. 8 shows the details of the track-and-hold amplifier of FIG. 7. It will be readily seen that the input amplifier 50 is very similar in construction to the input amplifier 40 of FIGS. 2 and 3. The major differences are that reset transistor Q6 has been eliminated, and transistors Q5 and Q7 receive on their bases the signals $V_{hold}$ and $V_{hold}*$, respectively. Resistor R12 has also been added to bias the transistor Q5.

The circuit of FIG. 8 has the following operating ranges and characteristics:

| | | |
|---|---|---|
| 1. | $V_{hold} < V_{in}$ | $V_{cap}$ tracks $V_{in}$ |
| 2. | $V_{in} < V_{hold} < V_{in} + 0.8$ | $V_{cap} = (V_{hold} + V_{in})/2$ |
| 3. | $V_{in} + 0.8 < V_{hold}$ | $V_{cap}$ holds previous value |

Because $V_{cap}$ continues to change when $V_{hold}$ is between $V_{in}$ and $V_{in}+0.8$, it is important that the transition time of $V_{hold}$ be as small as possible to minimize the error introduced in this region.

For the circuit shown in FIG. 8, it is important that the input signals have appropriate signal limits. In particular, the signal $V_{in}$ should be in the range from (GROUND+1.6 volts) to (Vcc$-1.6$ v). The ON and OFF voltage levels of the signals $V_{hold}$ and $V_{hold}*$ should be at least one volt beyond those of the input signal $V_{in}$, and preferably within 0.2 volts of Vcc and GROUND.

What has been described herein, then, is an improved peak detector circuit and a voltage-following circuit used therein that has broader application, such as in track-and-hold amplifiers. While specific embodiments have thus been described, it is intended that other embodiments as well be described by the following claims.

What is claimed is:

1. A peak detector, comprising:
   a capacitor having one terminal whereupon appears a capacitor voltage;
   a differential inverter having inputs respectively coupled to an input terminal of said peak detector and to said terminal of said capacitor to generate on an output an inverter voltage equal to the difference between twice said capacitor voltage and an input voltage appearing on said input terminal; and
   an input amplifier having inputs respectively coupled to said input terminal and to said output of said differential inverter and having an output coupled to said terminal of said capacitor to cause said capacitor voltage to equal said input voltage when the difference between said input voltage and said inverter voltage has a predetermined polarity, and to cause said capacitor voltage to equal the average of said input voltage and said inverter voltage when the difference between said input voltage and said inverter voltage has the opposite polarity.

2. A peak detector according to claim 1, wherein said input amplifier comprises:
   complementary emitter-follower input transistors having their bases coupled to said input terminal to receive said input voltage;
   complementary emitter-follower output transistors each having its base coupled to the emitter of a corresponding one of said input transistors, and having their emitters coupled to said terminal of said capacitor to drive said capacitor voltage; and
   a transistor having its base coupled to said differential inverter to receive said inverter voltage and having its emitter coupled to the base of one of said output transistors.

3. A peak detector according to claim 2, further comprising:
   a first reset transistor having its base coupled to a reset terminal of said peak detector to receive a reset signal appearing thereon, and having its emitter coupled to the base of the other of said output transistors to turn it off upon assertion of said reset signal; and
   a second reset transistor having its base coupled to said reset terminal, and its emitter coupled to said terminal of said capacitor to reset said capacitor voltage upon assertion of said reset signal.

4. A peak detector according to claim 1, wherein said predetermined polarity is positive, and wherein the other terminal of said capacitor is connected to a negative supply reference node.

5. A peak detector according to claim 4, wherein said negative supply reference node is ground.

6. A peak detector according to claim 1, wherein said predetermined polarity is negative, and wherein the other terminal of said capacitor is connected to a positive supply reference node.

7. A peak detector according to claim 1, further comprising means for resetting said capacitor voltage upon assertion of a reset signal.

8. A peak detector according to claim 7, wherein said resetting means comprises:
   a first reset transistor having its base coupled to a reset terminal of said peak detector to receive a reset signal appearing thereon, and its emitter coupled to the base of one of said output transistors to turn it off upon assertion of said reset signal; and
   a second reset transistor having its base coupled to said reset terminal, and its emitter coupled to said terminal of said capacitor to reset said capacitor voltage upon assertion of said reset signal.

9. A peak detector according to claim 1, wherein said differential inverter comprises:
   an op-amp having an inverting input, a non-inverting input coupled to said terminal of said capacitor, and an output coupled to said differential inverter output;
   a first resistor connected between said input terminal and said inverting input of said op-amp; and
   a second resistor having resistance equal to that of said first resistor connected between said inverting input and said output of said op-amp.

10. A peak detector, comprising:
    a capacitor having one terminal whereupon appears a capacitor voltage and the other terminal coupled to ground;
    an op-amp having an inverting input, a non-inverting input coupled to said terminal of said capacitor, and an output whereupon appears an inverter voltage;
    a first resistor connected between an input terminal of said peak detector and said inverting input of said op-amp;
    a second resistor having resistance equal to that of said first resistor connected between said inverting input and said output of said op-amp;
    complementary first and second emitter-follower input transistors having their bases coupled to said input terminal;
    a first emitter-follower output transistor having its base coupled to the emitter of said first input transistor, its collector coupled to a positive supply reference node, and its emitter coupled to said terminal of said capacitor to drive said capacitor voltage;
    a second emitter-follower output transistor having its base coupled to the emitter of said second input transistor, its collector coupled to ground, and its emitter coupled to said terminal of said capacitor to drive said capacitor voltage;
    a transistor having its base coupled to the output of said op-amp and its emitter coupled to the base of said second output transistor;
    a first reset transistor having its base coupled to a reset terminal of said peak detector to receive a reset signal appearing thereon, its collector coupled to ground, and its emitter coupled to the base of said first output transistor to turn it off upon assertion of said reset signal; and
    a second reset transistor having its base coupled to said reset terminal, its collector coupled to ground, and its emitter coupled to said terminal of said capacitor to reset said capacitor voltage upon assertion of said reset signal.

11. A peak detector, comprising:
    a capacitor having one terminal whereupon appears a capacitor voltage and another terminal coupled to a positive supply reference node;

an op-amp having an inverting input, a non-inverting input coupled to said terminal of said capacitor, and an output whereupon appears an inverter voltage;

a first resistor connected between an input terminal of said peak detector and said inverting input of said op-amp;

a second resistor having resistance equal to that of said first resistor connected between said inverting input and said output of said op-amp;

complementary first and second emitter-follower input transistors having their bases coupled to said input terminal;

a first emitter-follower output transistor having its base coupled to the emitter of said first input transistor, its collector coupled to said positive supply reference node, and its emitter coupled to said terminal of said capacitor to drive said capacitor voltage;

a second emitter-follower output transistor having its base coupled to the emitter of said second input transistor, its collector coupled to ground, and its emitter coupled to said terminal of said capacitor to drive said capacitor voltage;

a transistor having its base coupled to the output of said op-amp and its emitter coupled to the base of said first output transistor;

a first reset transistor having its base coupled to a reset terminal of said peak detector to receive a reset signal appearing thereon, its collector coupled to said positive supply reference node, and its emitter coupled to the base of said second output transistor to turn it off upon assertion of said reset signal; and a second reset transistor having its base coupled to said reset terminal, its collector coupled to said positive supply reference node, and its emitter coupled to said terminal of said capacitor to reset said capacitor voltage upon assertion of said reset signal.

* * * * *